United States Patent
Isobe

(10) Patent No.: US 6,881,656 B1
(45) Date of Patent: Apr. 19, 2005

(54) PRODUCTION PROCESS FOR SEMICONDUCTOR APPARATUS

(75) Inventor: Shinobu Isobe, Tateyama (JP)

(73) Assignee: UMC Japan, Chiba-ken (JP)

( * ) Notice: Subject to any disclaimer, the term of this patent is extended or adjusted under 35 U.S.C. 154(b) by 0 days.

(21) Appl. No.: 10/310,625

(22) Filed: Dec. 5, 2002

(30) Foreign Application Priority Data

Apr. 26, 2002 (JP) .................................... P2002-127488

(51) Int. Cl.⁷ ............................................. H01L 21/20
(52) U.S. Cl. ..................................... 438/584; 438/692
(58) Field of Search ............................ 438/699, 692, 438/655, 640, 637, 631, 624, 620, 584, 504, 309, 618, 622, 623

(56) References Cited

U.S. PATENT DOCUMENTS 5,679,610 A * 10/1997 Matsuda et al. ............ 437/225

2004/0106295 A1 * 6/2004 Cyrille et al. ............... 438/692

* cited by examiner

*Primary Examiner*—Evan Pert
*Assistant Examiner*—Monica D. Harrison
(74) *Attorney, Agent, or Firm*—Cohen, Pontani, Lieberman & Pavane

(57) ABSTRACT

A production process for a semiconductor apparatus is provided in which there is no danger of particle generation, and consequently no danger of associated problems resulting from the presence of particles, such as shorting, and which as a result, is capable of producing improved product yields, good product quality stability and improved product reliability.

A resist 13b is formed on those regions of a N-type silicon substrate 1 on which wiring is not to be formed, a conductive layer 15 is formed across the entire surface of the N-type silicon substrate 1 including the resist 13b, and the conductive layer 15 is then polished by mechanical polishing, as this result, the surface of the resist 13b is exposed.

12 Claims, 5 Drawing Sheets

PRODUCTION PROCESS FOR SEMICONDUCTOR APPARATUS

BACKGROUND OF THE INVENTION

1. Field of the Invention

The present invention relates to a production process for a semiconductor apparatus, and in particular to a production process for a semiconductor apparatus in which there is no danger of particle generation, and consequently no danger of associated problems resulting from the presence of particles, such as shorting, and which as a result, is capable of producing improved product yields, good product quality stability and improved product reliability.

2. Description of the Background Art

In conventional production processes for semiconductor apparatus such as IC, LSI and VLSI, dry etching is used for the patterning of wiring films, semiconductor films, insulating films and interlayer films.

FIG. 4 and FIG. 5 are process diagrams showing one example of a conventional production process for a semiconductor apparatus, in which wiring formed from a conductive material such as a metal is formed on top of an N-type silicon substrate (a semiconductor substrate).

First, as shown in FIG. 4A, a sputtering method or a vacuum deposition method is used to form an aluminum layer 2 on an N-type silicon substrate 1.

Next, as shown in FIG. 4B, a spin coating method is used to apply a negative type photoresist to the top of the aluminum layer 2, forming a resist layer 3.

Subsequently, as shown in FIG. 4C, a photomask 4 with a predetermined mask pattern is positioned on top of the resist layer 3, and by then irradiating the resist layer 3 with ultraviolet radiation 5 through the photomask 4, the mask pattern of the photomask 4 is burnt into the resist layer 3. The photomask 4 has openings 4a only in those sections which correspond with the wiring of the N-type silicon substrate 1, and consequently within the resist layer 3, only those sections of the resist 3a which correspond with the wiring on the N-type silicon substrate 1 are irradiated by the ultraviolet radiation 5 and are hardened to become insoluble in the developing solution, whereas the remaining sections of the resist 3b are not subjected to the ultraviolet radiation 5, and are consequently soluble in the developing solution.

Next, as shown in FIG. 4D, the resist layer 3 is developed, and the covered sections of the resist 3b are dissolved in the developing solution. As a result, the resist layer 3 is reduced to only those resist sections 3a corresponding with the wiring pattern.

Subsequently, as shown in FIG. 5A, the aluminum layer 2 is subjected to dry etching 6 using a plasma, with this resist layer 3 functioning as a mask, and within the aluminum layer 2, only those sections of aluminum 2a which correspond with the wiring are left on the substrate, whereas the remaining sections of the aluminum 2b are removed. Here, because those sections of the aluminum 2b outside the wiring are removed, the surface of the N-type silicon substrate 1 is exposed within these regions 2b where the aluminum has been removed, as shown in FIG. 5B.

Next, as shown in FIG. 5C, the resist layer 3 is removed. As a result, from the aluminum layer 2, only those sections of the aluminum 2a corresponding with the wiring remain on the surface of the N-type silicon substrate 1, and this remaining aluminum 2a forms a predetermined wiring pattern 7.

However, in the conventional production process for a semiconductor apparatus described above, when the aluminum layer 2 is subjected to dry etching 6, once gasified unwanted matter and particles (unwanted matter) once adhered to the internal walls of the etching apparatus can adhere to the exposed surface of the N-type silicon substrate 1 again, resulting in a danger of potential shorting of the wiring 7.

In addition, in dry etching 6, because there are an extremely large number of gas varieties used as etchants, the etching process can become quite complicated. Furthermore, the apparatus must be changed for each gas variety, meaning the number of apparatuses used is also extremely large, and this is a factor in increasing the production costs.

SUMMARY OF THE INVENTION

The present invention takes the above problems into consideration, with an object of providing a production process for a semiconductor apparatus in which there is no danger of particle generation, and consequently no danger of associated problems resulting from the presence of particles, such as shorting, and which as a result, is capable of producing improved product yields, good product quality stability and improved product reliability.

In order to resolve the problems described above, the present invention provides a production process for a semiconductor apparatus as described below.

Namely, a production process for a semiconductor apparatus according to a first aspect of the present invention is a production process for a semiconductor apparatus in which a thin film with a predetermined pattern is formed on top of a semiconductor substrate, comprising a resist layer formation step for forming a resist layer with a predetermined pattern on top of a semiconductor substrate, a film formation step for forming a thin film on top of the semiconductor substrate including the resist layer, and a polishing step for exposing the surface of the resist by polishing the thin film.

A production process for a semiconductor apparatus according to a second aspect of the present invention is the production process for a semiconductor apparatus according to the first aspect, wherein following the polishing step, the aforementioned film formation step and the polishing step are repeated.

A production process for a semiconductor apparatus according to a third aspect of the present invention is a production process for a semiconductor apparatus according to the first aspect, wherein a resist removal step for removing at least a portion of the resist is provided following the polishing step.

A production process for a semiconductor apparatus according to a fifth aspect of the present invention is a production process for a semiconductor apparatus according to the first aspect, wherein the polishing step utilizes either mechanical polishing or chemical mechanical polishing (CMP).

A production process for a semiconductor apparatus according to a sixth aspect of the present invention is a production process for a semiconductor apparatus according to the first aspect, wherein the thin film is any one of a conductive material, a dielectric material, a semiconductor and an insulator.

DETAILED DESCRIPTION OF THE PREFERRED EMBODIMENTS

Figure 5A:
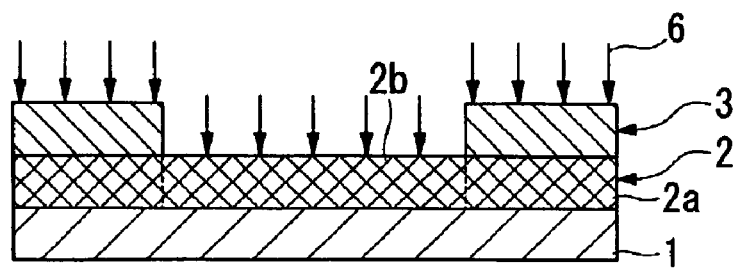
FIG. 5 is a process diagram showing a conventional production process for a semiconductor apparatus.
Figure 5B:
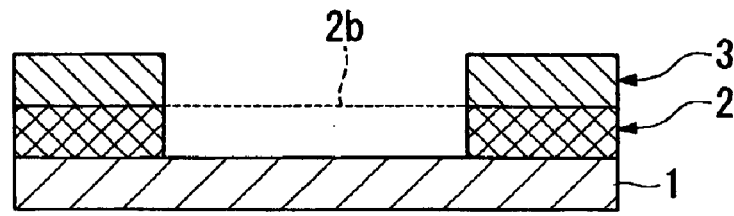
Figure 5C:
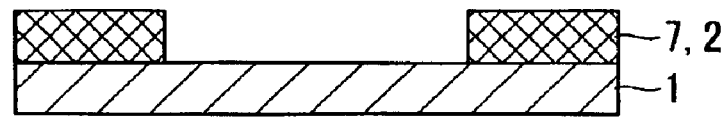

As follows is a description of an embodiment of a production process for a semiconductor apparatus according to the present invention, based on FIG. 1 and FIG. 2. Here, the description focuses on the formation of wiring formed from a conductive thin film with a predetermined pattern on a N-type silicon substrate (semiconductor substrate). In FIG. 1 and FIG. 2, those structural elements which are identical with elements shown in FIG. 4 and FIG. 5 are labeled using the same symbols.

Figure 1A:
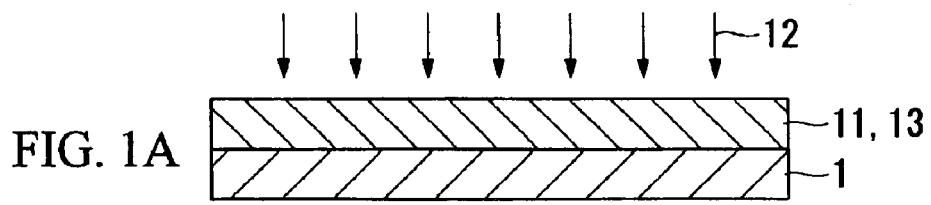
FIG. 1 is a process diagram showing a production process for a semiconductor apparatus according to an embodiment of the present invention.

First, as shown in FIG. 1A, a negative type photoresist 11 is formed on top of a N-type silicon substrate 1 using a coating method such as spin coating, spray coating or dip coating. Next, the photoresist 11 is subjected to infrared heating 12 with an infrared lamp at about a temperature of 100° C. for example. By subjecting the photoresist 11 to infrared heating 12 any volatile components such as organic solvents incorporated within the photoresist are volatilized and removed, and a cross linking agent promotes a chemical reaction leading to the formation of a network type structure and converting the photoresist to a hard resist layer 13. As an alternative to the infrared lamp described above, the infrared heating 12 could also be achieved using an infrared heating furnace or the like.

Examples of suitable photoresists include typical commercially available negative type photoresists such as bis-diazide based photoresists and the like. A method for removing surface roughness in which the resist layer 13 is heated at a higher temperature than that produced by the aforementioned infrared heating 12, such as a temperature within a range from 130 to 150° C., in order to improve the transferability, may also be employed. By employing this type of method, the roughness of the resist surface is removed or reduced, and the film also increases in hardness, and as a result, the dimensional variations in the resist layer following ultraviolet irradiation are small, and pattern shape variations can also be reduced.

Figure 1B:
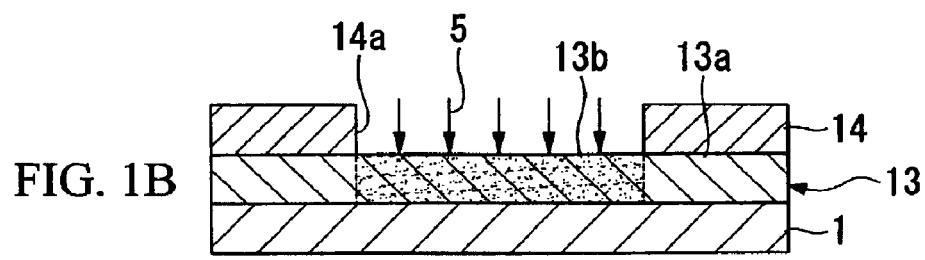

Next, as shown in FIG. 1B, a photomask 14 with a predetermined mask pattern is positioned on top of the resist layer 13, and the photomask 14 is then irradiated with ultraviolet radiation 5, burning the mask pattern of the photomask 14 into the resist layer 13.

The photomask 14 comprises openings 14a in all regions except those regions which correspond with the aforementioned wiring, and consequently within the resist layer 13, those sections of the resist 13a which correspond with the wiring are not irradiated by the ultraviolet radiation 5 and remain soluble in the developing solution, whereas the remaining sections of the resist 13b are subjected to the ultraviolet radiation 5 and become insoluble in the developing solution.

Figure 1C:
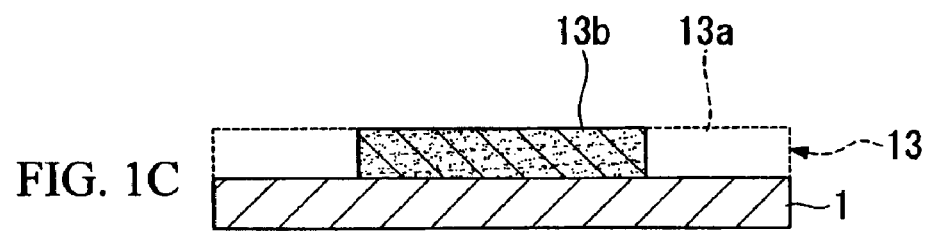

Next, as shown in FIG. 1C, the resist layer 13 is developed. Within the resist layer 13, the entire resist is dissolved in the developing solution except for those sections of the resist 13b irradiated with the ultraviolet radiation 5. In other words, on the surface of the N-type silicon substrate 1, the resist 13a is removed from those regions in which wiring is to be formed, exposing the surface of the substrate, whereas the regions in which no wiring is to exist remain covered with a resist 13b of a predetermined thickness.

Figure 1D:
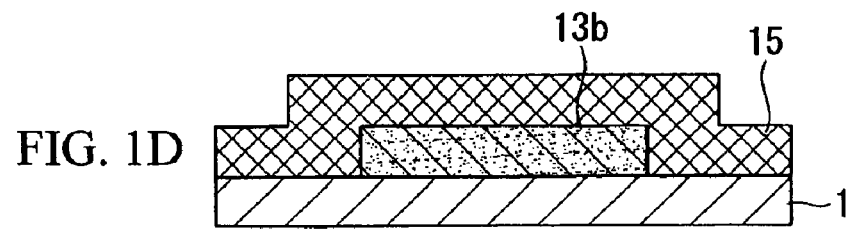

Subsequently, as shown in FIG. 1D, a vacuum deposition method, sputtering method and plating method etc. is used to form a conductive layer 15 formed from a metal such as gold or aluminum across the entire surface of the N-type silicon substrate 1 including the resist 13b. Because this conductive layer 15 is formed with a substantially uniform thickness over the entire surface of the N-type silicon substrate 1, including the resist 13b, the total film thickness of those regions in which the resist 13b still exists will be thicker than the other regions by an amount equivalent to the thickness of the resist 13b.

Figure 2A:
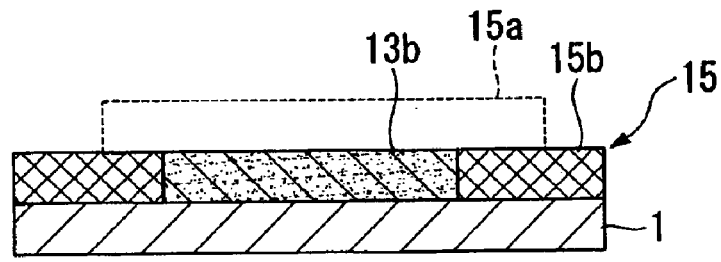
FIG. 2 is a process diagram showing a production process for a semiconductor apparatus according to an embodiment of the present invention.

Next, as shown in FIG. 2A, the conductive layer 15 is polished to a target thickness, for example the thickness of the conductive layer 15, using mechanical polishing, thereby exposing the surface of the resist 13b.

Figure 3:
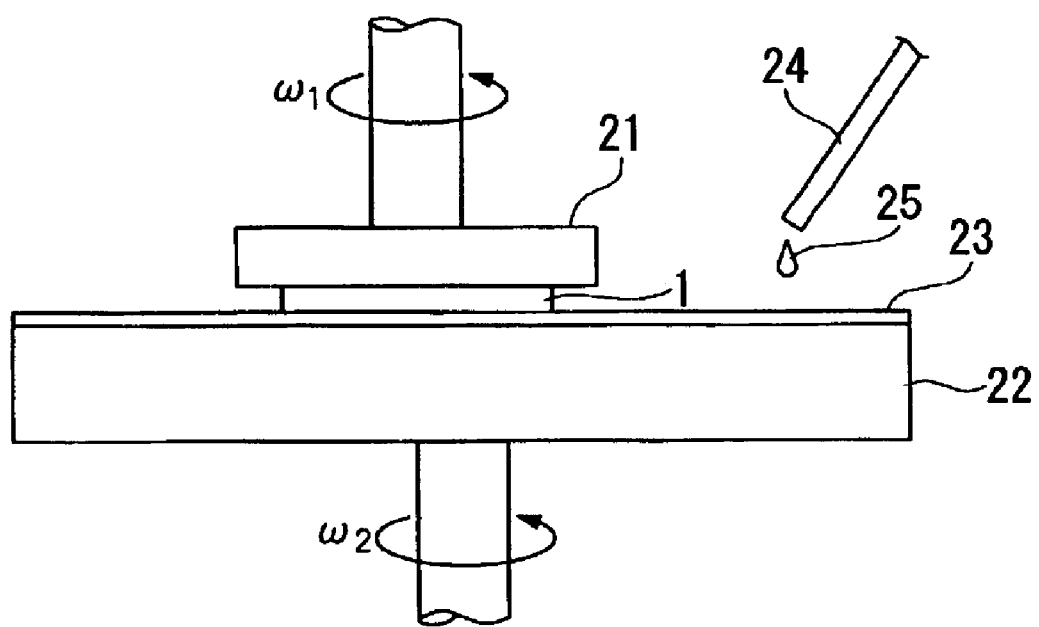
FIG. 3 is a side view showing mechanical polishing according to an embodiment of the present invention.
Figure 4A:
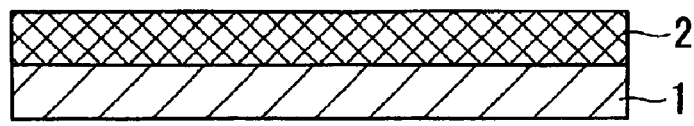
FIG. 4 is a process diagram showing a conventional production process for a semiconductor apparatus.
Figure 4A:
Figure 4B:
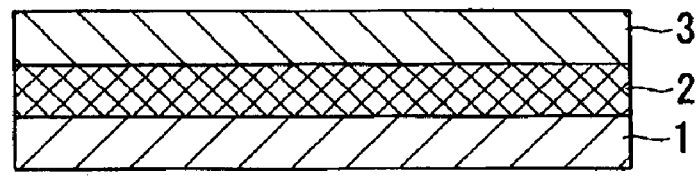
Figure 4B:
Figure 4C:
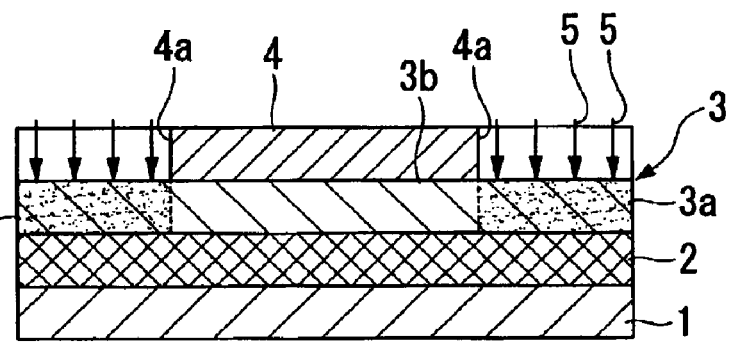
Figure 4C:
Figure 4D:
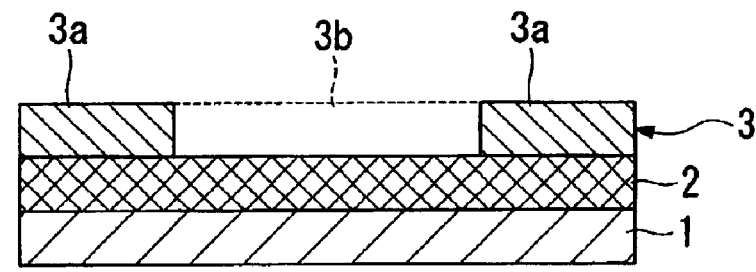

As shown in FIG. 3, in this mechanical polishing process, the N-type silicon substrate 1 is mounted on a polishing head 21 so that the surface of the conductive layer 15 becomes the polishing surface, and this N-type silicon substrate 1 is then mounted onto a polishing pad 23 fixed to a base plate 22 so that the conductive layer 15 contacts the polishing pad 23. Then, with a slurry 25 containing fine alumina particles being dropped onto the polishing pad 23 from a nozzle 24, the N-type silicon substrate 1 is pressed down with a constant pressure by the polishing head 21 and rotated at a constant angular velocity $\omega_1$, while the polishing pad 23 is rotated at a constant angular velocity $\omega_2$, and the each other's axis are shifted, enabling the conductive layer 15 to be polished down to a target thickness.

By using this type of mechanical polishing, the protruding sections of the conductive layer 15, namely those sections of the conductive layer 15a formed on top of the resist 13b, are removed, and the remaining sections of the conductive layer 15b remain on the N-type silicon substrate 1 as a wiring region.

In the mechanical polishing process, depending on the type of material being polished, chemical mechanical polishing (CMP) may also be used.

In chemical mechanical polishing (CMP), alkali solutions such as potassium hydroxide(KOH), acidic solutions such as iron (II) nitrate $(Fe(NO_3)_2)$, and acidic solutions such as hydrogen peroxide($H_2O_2$) are mixed with the slurry to improve the polishing precision.

Figure 2B:
Figure 2B:
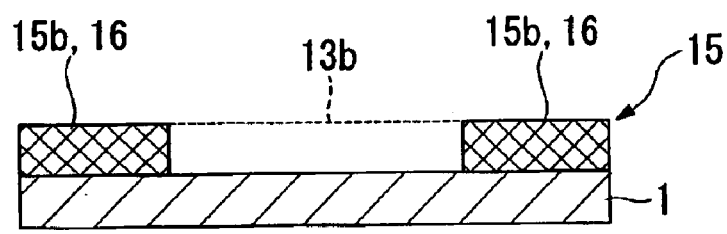

Next, as shown in FIG. 2B, only the resist 13b is removed by wet etching. In this process, an etching solution comprising of two or more selected from a group consisting of sulfuric acid ($H_2SO_4$), ammonia water ($NH_4OH$) and hydrogen peroxide ($H_2O_2$) is used with predetermined quantities respectively.

In this manner, wiring 16 formed from a thin film of metal such as gold or aluminum can be formed on top of the N-type silicon substrate 1 without any danger of particles (unwanted matter) adhering to the substrate.

If a dielectric material is used instead of the conductive material, then a thin film condenser can be formed. Furthermore, if a semiconductor is used, then a semiconductor element such as a transistor or a diode can be formed. Furthermore, if an insulating material is used, then an insulating layer with excellent insulating properties can be formed.

Furthermore, the area surrounding the wiring 16 can also be covered with an insulating layer such as silicon oxide ($SiO_2$).

Figure 2C:
Figure 2C:
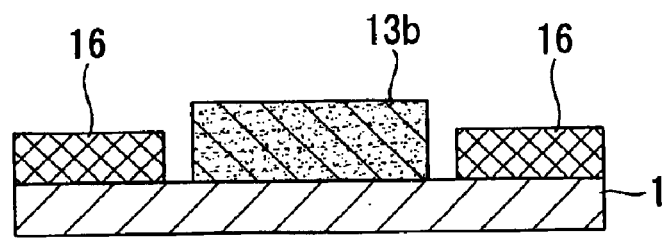
Figure 2D:
Figure 2D:
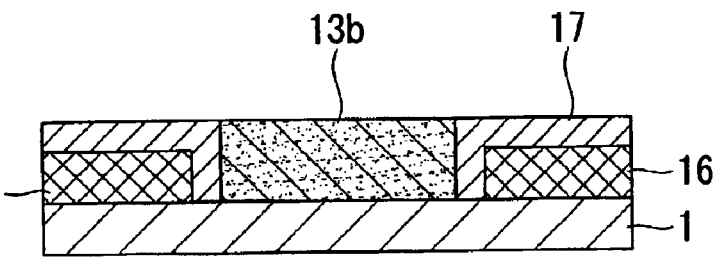

In such a case, as shown in FIG. 2C, a resist 13b is left on the N-type silicon substrate 1 incorporating the wiring 16, and then, as shown in FIG. 2D, an insulating layer 17 formed from SiO$_2$ or the like is formed across the entire surface of the N-type silicon substrate 1 including the resist 13b, in a similar manner to the conductive layer 15 described above. Next, the insulating layer 17 is polished to a target thickness, for example the thickness of the conductive layer 17, using mechanical polishing, thereby exposing the surface of the resist 13b.

Subsequently, if wet etching is used to remove solely the resist 13b, then the wiring 16 and an insulating layer 17 can be formed on the N-type silicon substrate 1 without any danger of particles (unwanted matter) adhering to the substrate.

As described above in detail, according to a production process for a semiconductor apparatus of this embodiment, a thin resist 13b with a predetermined pattern is formed on the surface of a N-type silicon substrate 1, a conductive layer 15 is formed across the entire surface of the N-type silicon substrate 1 including the resist 13b, and the conductive layer 15 is then polished by mechanical polishing to expose the surface of the resist 13b, and consequently there is no need to use dry etching for patterning of the conductive layer 15, and the danger associated with problems such as the adhesion of particles (unwanted matter) to the substrate disappears, meaning the danger of problems such as shorting of the wiring also disappears.

Furthermore, wiring 16 of a desired shape can be obtained simply by patterning the resist layer, and consequently the process is extremely simple, and the production costs can be reduced significantly.

As described above, a production process for a semiconductor apparatus can be provided in which there is no danger of particle generation, and consequently no danger of associated problems resulting from the presence of particles, such as shorting, and which as a result, is capable of producing improved product yields, good product quality stability and improved product reliability.

One embodiment of the production process for a semiconductor apparatus of the present invention has been described above based on the drawings, but the construction of the present invention is not limited to that presented in the embodiment, and variations and modifications of the design are possible, provided they retain the gist of the present invention.

For example, in the embodiment described above the resist layer 13 employed a negative type resist, but similar effects can also be achieved using a positive type resist.

Furthermore, the embodiment described a construction in which the area surrounding the wiring 16 was covered with an insulating layer 17 formed from silicon oxide (SiO$_2$) or the like, but the material for the insulating layer 17 is not restricted to silicon oxide (SiO$_2$), and any material with insulating properties could be used.

As described above, a production process for a semiconductor apparatus according to the present invention comprises a resist layer formation step for forming a resist layer with a predetermined pattern on top of a semiconductor substrate, a film formation step for forming a thin film on top of the semiconductor substrate including the resist layer, and a polishing step for polishing the thin film and exposing the surface of the resist, and as a result, there is no need to use dry etching for patterning of the aforementioned thin film, and problems such as the adhesion of particles (unwanted matter) to the substrate can be prevented, meaning problems such as shorting of the wiring can also be prevented. Accordingly, deterioration in the electrical characteristics caused by particles (unwanted matter) or the like can also be prevented.

Furthermore, because only the resist layer need be subjected to patterning, the process is extremely simple, and the production costs can be reduced significantly.

Accordingly, there is no danger of particle generation, and no danger of associated problems resulting from the presence of unwanted matter such as particles, such as shorting, and as a result the yield of the semiconductor apparatus can be improved, good stability in the quality of the apparatus can be ensured, and the reliability of the product can also be improved.

What is claimed is:

1. A production process for a semiconductor apparatus in which a thin film with a predetermined pattern is formed on top of a semiconductor substrate, comprising a resist layer formation step for forming a resist layer with a predetermined pattern on top of a semiconductor substrate, a film formation step for forming a thin film on top of said semiconductor substrate and on top of said resist layer, and a polishing step for polishing said thin film such that some of the thin film is removed to expose a surface of said resist layer, but the thin film remains elsewhere on the substrate.

2. A production process for a semiconductor apparatus according to claim 1, wherein following said polishing step, said film formation step and said polishing step are repeated.

3. A production process for a semiconductor apparatus according to claim 1, wherein a resist layer removal step for removing at least a portion of said resist layer is provided following said polishing step.

4. A production process for a semiconductor apparatus according to claim 3, wherein said resist layer removal step uses an etching solution with predetermined quantities respectively comprising of two or more selected from a group consisting of sulfuric acid, ammonia, and hydrogen peroxide.

5. A production process for a semiconductor apparatus according to claim 1, wherein said polishing step utilizes either one of mechanical polishing and chemical mechanical polishing.

6. A production process for a semiconductor apparatus according to claim 1, wherein said thin film is any one of a conductive material, a dielectric material, a semiconductor and an insulator.

7. A production process for a semiconductor apparatus according to claim 1, wherein during said resist layer formation step infrared heating is applied to said resist layer.

8. A production process for a semiconductor apparatus according to claim 7, wherein during said resist layer formation step, following said infrared heating, additional heating is conducted at a higher temperature than said infrared heating.

9. A production process for a semiconductor apparatus according to claim 1, wherein said resist layer formation step utilizes a negative type resist.

10. A production process for a semiconductor apparatus according to claim 1, wherein said film formation step forms a thin film of either gold or aluminum.

11. A production process for a semiconductor apparatus according to claim 1, wherein said resist layer formation step utilizes an application method selected from a group consisting of spin coating, spray coating and dip coating.

12. A production process for a semiconductor apparatus according to claim 1, wherein said film formation step utilizes any one of a vacuum deposition method, sputtering method and plating method.

* * * * *